US012777933B2

(12) United States Patent
Akalanne et al.

(10) Patent No.: US 12,777,933 B2
(45) Date of Patent: Oct. 27, 2026

(54) IMPINGEMENT COOLING PROVIDING ENHANCED LOCALIZED COOLING OF A HEATSINK

(71) Applicant: ABACO SYSTEMS, INC., Huntsville, AL (US)

(72) Inventors: Lucius Akalanne, Wiltshire (GB); Joo Han Kim, Huntsville, AL (US); Brian Hoden, Albuquerque, NM (US)

(73) Assignee: ABACO SYSTEMS, INC., Huntsville, AL (US)

( * ) Notice: Subject to any disclaimer, the term of this patent is extended or adjusted under 35 U.S.C. 154(b) by 199 days.

(21) Appl. No.: 18/265,062

(22) PCT Filed: Dec. 23, 2020

(86) PCT No.: PCT/US2020/066759
§ 371 (c)(1),
(2) Date: Jun. 2, 2023

(87) PCT Pub. No.: WO2022/139830
PCT Pub. Date: Jun. 30, 2022

(65) Prior Publication Data
US 2024/0107714 A1 Mar. 28, 2024

(51) Int. Cl.
*H10W 40/47* (2026.01)
*B33Y 80/00* (2015.01)

(52) U.S. Cl.
CPC .......... *H10W 40/475* (2026.01); *B33Y 80/00* (2014.12)

(58) Field of Classification Search
CPC ......................... H10W 40/475; H01L 23/4735
See application file for complete search history.

(56) References Cited

U.S. PATENT DOCUMENTS 5,270,572 A 12/1993 Nakajima et al.
5,576,932 A 11/1996 Bishop et al.
(Continued)

FOREIGN PATENT DOCUMENTS

EP 2151863 A1 2/2010
EP 3723464 A1 10/2020
(Continued)

OTHER PUBLICATIONS

Elma Adds Liquid Flow Through (LFT) Cooling to OpenVPX Development Platform (Year: 2018).*
(Continued)

*Primary Examiner* — Eric S Ruppert
(74) *Attorney, Agent, or Firm* — Meunier Carlin & Curfman LLC

(57) ABSTRACT

A heatsink having enhanced localized cooling. The heatsink comprises a wall; a heatframe; a coolant channel between the wall and the heatframe, wherein a bulk coolant flows through the coolant channel; and one or more nozzles that extend into the coolant channel and proximate the wall and/or the heatframe, wherein a high-pressure coolant flows through the one or more nozzles, mixes with the bulk coolant in the coolant channel, and impinges on a cooling area of the wall and/or the heatframe proximate an outlet of the one or more nozzles to provide enhanced localized cooling to at least a portion of a heat producing device that is proximate to or in partial contact with the wall and/or the heatframe proximate to the cooling area of the wall and/or the heatframe.

20 Claims, 5 Drawing Sheets

(56) References Cited

U.S. PATENT DOCUMENTS

| | | | | |
|---|---|---|---|---|
| 7,044,199 | B2 | 5/2006 | Thayer | |
| 7,149,084 | B2 | 12/2006 | Matsushima et al. | |
| 7,149,087 | B2 | 12/2006 | Wilson et al. | |
| 8,174,826 | B2 | 5/2012 | El-Essawy et al. | |
| 10,533,809 | B1 * | 1/2020 | Sherrer | H01L 23/4735 |
| 11,031,312 | B2 | 6/2021 | Poltorak | |
| 11,428,478 | B2 | 8/2022 | Zhou | |
| 11,985,795 | B2 | 5/2024 | Moriuchi | |
| 2002/0108743 | A1 | 8/2002 | Wirtz | |
| 2002/0112847 | A1 | 8/2002 | Nakahama | |
| 2002/0185260 | A1 | 12/2002 | Calaman et al. | |
| 2005/0083655 | A1 | 4/2005 | Jairazbhoy | |
| 2005/0111188 | A1 | 5/2005 | Bhattacharya | |
| 2006/0157225 | A1 | 7/2006 | Martin | |
| 2007/0124934 | A1 * | 6/2007 | Peng | F28F 13/003<br>257/E23.098 |
| 2007/0129434 | A1 | 6/2007 | Peng | |
| 2008/0104970 | A1 * | 5/2008 | Suzuki | H01L 23/427<br>165/104.33 |
| 2008/0166492 | A1 | 7/2008 | Lu et al. | |
| 2008/0179046 | A1 | 7/2008 | Hisano | |
| 2012/0175094 | A1 * | 7/2012 | Rice | F28F 3/12<br>165/170 |
| 2012/0325436 | A1 * | 12/2012 | Shedd | H01L 23/427<br>165/104.11 |
| 2013/0233523 | A1 | 9/2013 | Parida | |
| 2014/0190669 | A1 | 7/2014 | Hoshino et al. | |
| 2016/0118317 | A1 * | 4/2016 | Shedd | F28F 9/26<br>257/712 |
| 2019/0341327 | A1 | 11/2019 | Teysseyre | |
| 2020/0100351 | A1 | 3/2020 | Raymond | |

FOREIGN PATENT DOCUMENTS

| | | | | |
|---|---|---|---|---|
| GB | 2 536 689 | A | | 9/2016 |
| JP | 2005079337 | A | * | 3/2005 |
| WO | 9906782 | | | 2/1999 |

OTHER PUBLICATIONS

International Preliminary Report on Patentability for International Application No. PCT/US2020/066759 dated Jul. 6, 2023.

International Preliminary Report on Patentability for International Application No. PCT/US2020/066758 dated Jul. 6, 2023.

International Search Report and Written Opinion for International Application No. PCT/US2020/066758 dated Jul. 6, 2023.

PCT Application No. PCT/US2020/066759, International Search Report and Written Opinion, issued Sep. 28, 2021.

Non-Final Office Action in connection to U.S. Appl. No. 18/265,059, dated Feb. 4, 2025.

Office Action in connection to Canadian Application No. 3,200,175, dated Jan. 8, 2026.

* cited by examiner

IMPINGEMENT COOLING PROVIDING ENHANCED LOCALIZED COOLING OF A HEATSINK

TECHNICAL FIELD

The subject matter described herein relates generally to heatsinks and, more particularly, to cooling a localized area of a heatsink through impingement of a fluid onto or proximate the localized area to provide localized enhanced cooling of a portion of the heatsink.

BACKGROUND

Printed circuit boards (PCBs or PC boards) used in many electronic devices on which at least one chip (or other electronic component) is mounted generate significant amounts of heat. Such heat, if not managed, can lead to failure of the critical components that form the PCB. Prior attempts at cooling PCBs include forced air, heat pipes, heatsinks, cold plates, and the like, each have varying levels of success, but each with their own drawbacks. For example, forced air cooling may not be useful in high pollution environments and/or environments with dust or explosive gasses. Heatsinks are effective passive means for cooling electronic components on a PCB, but a typical heatsink cools each component on a PCB equally even though each component may not produce the same amount of heat. Cold plates do not target specific heat producing devices and in some instances may have unwanted pressure drop across the coolant channel.

Therefore, devices and systems are desired that overcome challenges in the art, some of which are described above. Furthermore, it is desired to have a cooling module that complies with the ANSI/VITA 48.4 Liquid Flow Through VPX Plug-In Module standard, which is fully incorporated by reference. This standard establishes the mechanical design requirements for a liquid flow-through (LFT) cooled electronic VPX module. The standard is available at https://www.vita.com/Standards. VPX, also known as VITA 46, is an ANSI standard (ANSI/VITA 46.0-2019) that provides VMEbus-based systems with support for switched fabrics over a new high speed connector. VITA is the VME International Trade Association, and ANSI is the American National Standards Institute.

SUMMARY

Disclosed and described herein are devices and systems that remove heat from heat producing devices using localized enhanced cooling of a portion of a heatsink. The devices and systems comprise a wall; a heatframe; a coolant channel formed between the wall and the heatframe, wherein a bulk coolant flows through the coolant channel; and one or more nozzles that extend into the coolant channel and proximate the wall and/or the heatframe, wherein a high-pressure coolant flows through the one or more nozzles, mixes with the bulk coolant in the coolant channel, and impinges on a cooling area of the wall and/or the heatframe proximate an outlet of the one or more nozzles to provide enhanced localized cooling to at least a portion of a heat producing device that is proximate to or in partial contact with the wall and/or the heatframe proximate to the cooling area of the wall and/or the heatframe.

In some instances, the devices and systems further comprise one or more high-pressure manifolds, wherein the high-pressure coolant flows from the one or more high-pressure manifolds into the one or more nozzles.

Alternatively or optionally, the devices and systems may include a piece of thermally-conductive material, wherein the piece of thermally-conductive material is at least partially embedded into, attached to or proximate to the wall and/or the heatframe proximate to the cooling area of the wall and/or the heatframe, wherein the heat producing device is proximate to or in partial contact with the piece of thermally-conductive material. The piece of thermally-conductive material may be comprised of copper, aluminum, silver, gold, thermally conductive ceramic, thermally conductive diamond composite, combinations thereof, or any other thermally-conductive material. If attached to the wall and/or the heatframe, wherein the piece of thermally-conductive material may be attached to the wall and/or the heatframe by welding, soldering, brazing, gluing or screwing the thermally-conductive material to the wall and/or the heatframe. The piece of thermally-conductive material may have a thermal-conductivity rating that is equal to or greater than 150 W/mK.

In some instances, the high-pressure coolant flow mixes with the bulk coolant in the coolant channel causing turbulence in the coolant flow proximate the cooling area of the wall and/or the heatframe.

In some instances, at least a portion of the heatsink is formed by 3D printing.

In some instances, the cooling area of the heatsink occurs in an area of 100 mm$^2$ to 2500 mm$^2$.

In some instances, the heat producing device comprises an electronic device such as one or more of a central processing unit (CPU), a graphics processing unit (GPU), a field-programmable gate array (FPGA), a platform control hub (PCH), a PCI express switch, and the like.

In some instances, at least one of the bulk coolant and/or the high-pressure coolant is a gas (ambient, compressed, or refrigerated). Alternatively or optionally, at least one of the bulk coolant and/or the high-pressure coolant is a liquid and the devices and systems are in compliance with a ANSI/VITA 48.4 Liquid Flow Through VPX Plug-In Module standard.

The high-pressure coolant of the systems and devices is at a pressure higher than the bulk coolant.

In some instances, at least one of the one or more nozzles is not perpendicular to the wall and/or the heatframe.

Additional and/or alternative features of the devices and systems are described herein. Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1A:
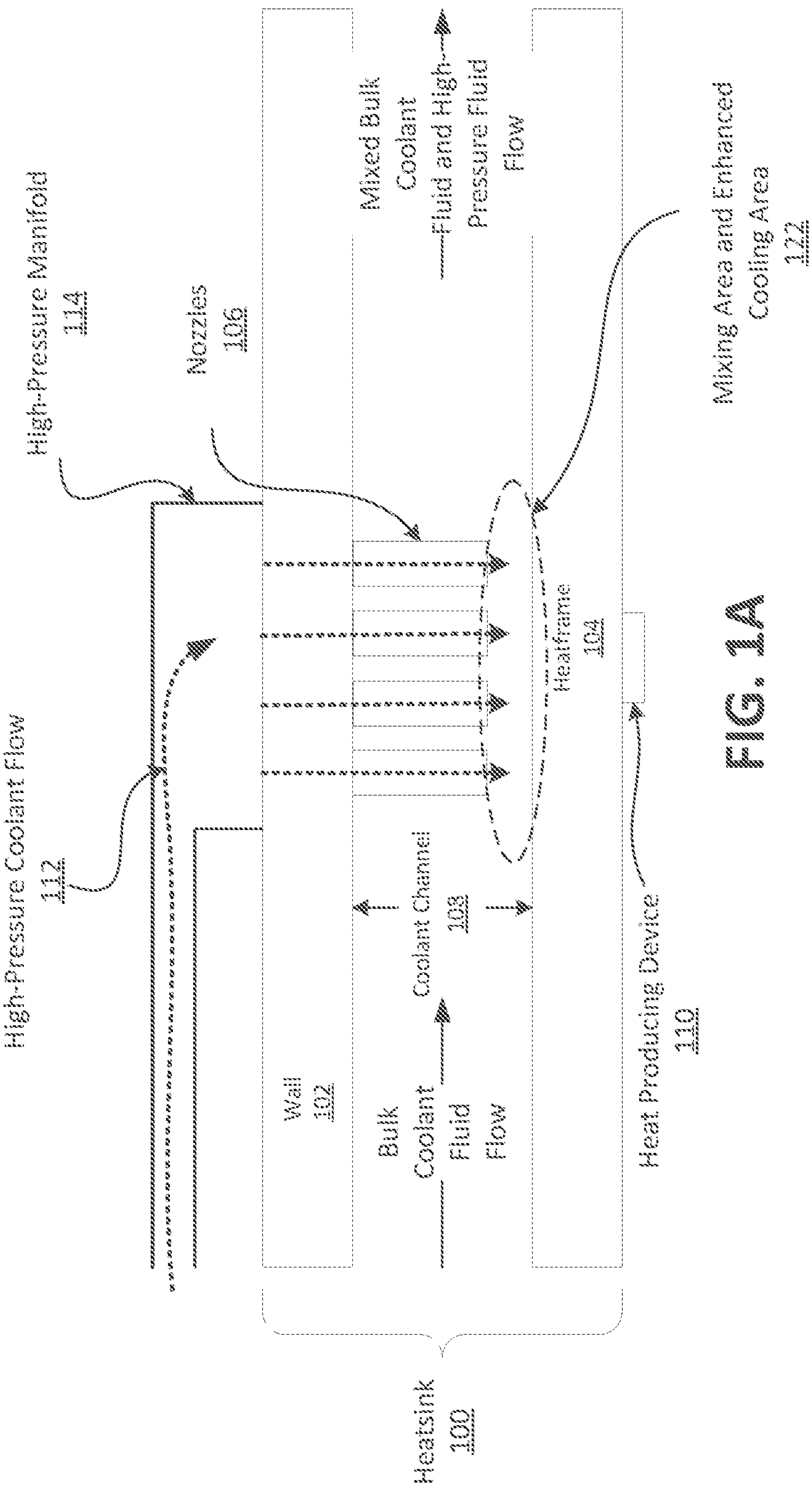
FIG. 1A is a cross-section view of a heatsink having an enhanced cooling area caused by impingement of a high-pressure coolant on an area of a wall or heatframe of the heatsink and by turbulence of a bulk coolant in a coolant channel caused by the high-pressure coolant.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

The embodiments disclosed herein facilitate providing enhanced localized cooling in areas of a heatsink. As shown at least in FIG. 1A, a heatsink 100 is comprised of a wall 102 and a heatframe 104, with one or more coolant channels 108 sandwiched between the wall 102 and the heatframe 104 through which a bulk coolant fluid flows. Generally, the coolant channels 108 form a closed loop, so it is to be appreciated that the drawings herein show only a cross-sectional view of the heatsink 100. In some instances, cooling fins (not shown) may be located on portions of the heatsink 100 and would generally be located on a portion of the exterior of the wall 102 and/or the heatframe.

Further comprising the heatsink 100 of FIG. 1A are one or more nozzles 106 that extend into the cooling channel 108 and a high-pressure manifold 114 from which high-pressure coolant fluid 112 flows from the high-pressure manifold 114 through channels in the one or more nozzles 106 and impinges on an area of the heatframe 104 proximate a heat-producing device 110. The high-pressure coolant 112 mixes with the bulk coolant in the coolant channel 108 and flows through the heatsink. As used herein, "high-pressure" is relative to the pressure of the bulk coolant fluid. In other words, "high pressure" means at a pressure higher than the pressure of the bulk coolant fluid so that the high-pressure fluid flows through the one or more nozzles 106 and into the coolant channel 108, and not vice-versa. As examples, the bulk coolant fluid may be at a pressure of 15 psi to 20 psi, while the high-pressure coolant fluid may be at a pressure of 110 to 150 percent of the pressure of the bulk coolant.

In some instances, the bulk coolant and the high-pressure coolant may be a gas (ambient, compressed, or refrigerated), while in other instances the bulk coolant and the high-pressure coolant may be a liquid. For example, the heatsink may be in compliance with a ANSI/VITA 48.4 Liquid Flow Through VPX Plug-In Module standard. In other instances, the bulk coolant may be a liquid while the high-pressure coolant may be a gas, or vice-versa.

The high-pressure coolant fluid exiting the one or more nozzles 106 in the coolant channel 108 causes a significant increase in mixing (turbulent kinetic energy) due to a combination of micro-impingent and bulk flow through, thus creating a mixing area and enhanced cooling area 122. The close proximity of the perpendicular micro jets to the hot device 110 disturbs and destroys typical thermal insulative (boundary layer) layers of the bulk flow. As an example, the one or more nozzles may be 0 to 95% of the channel thickness from the inner wall of the heatframe 104. While each of the one or more nozzles 106 shown in FIG. 1A extend the same length into the coolant channel 108, it is to be appreciated that each nozzle 106, if there are a plurality of nozzles, may extend varying distances into the coolant channel 108. Also, while the one or more nozzles 106 are shown in the figures to extend from the wall 102 into the coolant channel 108 toward the heatframe 104, it is to be appreciated that they may also extend from the heatframe 104 into the coolant channel 108 toward the wall 102, with appropriate placement of the high-pressure manifold 114. In some instances, there may be one or more nozzles 106 extending from the wall 102 into the coolant channel 108 toward the heatframe 104 and one or more nozzles 106 extending from the heatframe 104 into the coolant channel 108 toward the wall 102, with appropriate placement of high-pressure manifolds 114

Also shown in FIG. 1A is a heat producing device 110. The enhanced localized cooling caused by the impingement cooling module in the heatsink 100 is used to cool the heat producing device 110. In some instances, the heat producing device 110 is at least in partial contact with the wall 102 or the heatframe 104 proximate to the outlets of the one or more nozzles 106, such that enhanced localized cooling is provided to the heat producing device 110. Generally, the heat producing device 110 is an electronic device such as, for example, one or more of a central processing unit (CPU), a graphics processing unit (GPU), a field-programmable gate array (FPGA), a platform control hub (PCH), a PCI express switch, and the like. In some instances the electronic device may be mounted on a PC board. In other instances, the heat producing device may be mechanical or chemical. The embodiments disclosed herein can be used to provide enhanced localized cooling to any form of heat producing device 110.

Figure 1B:
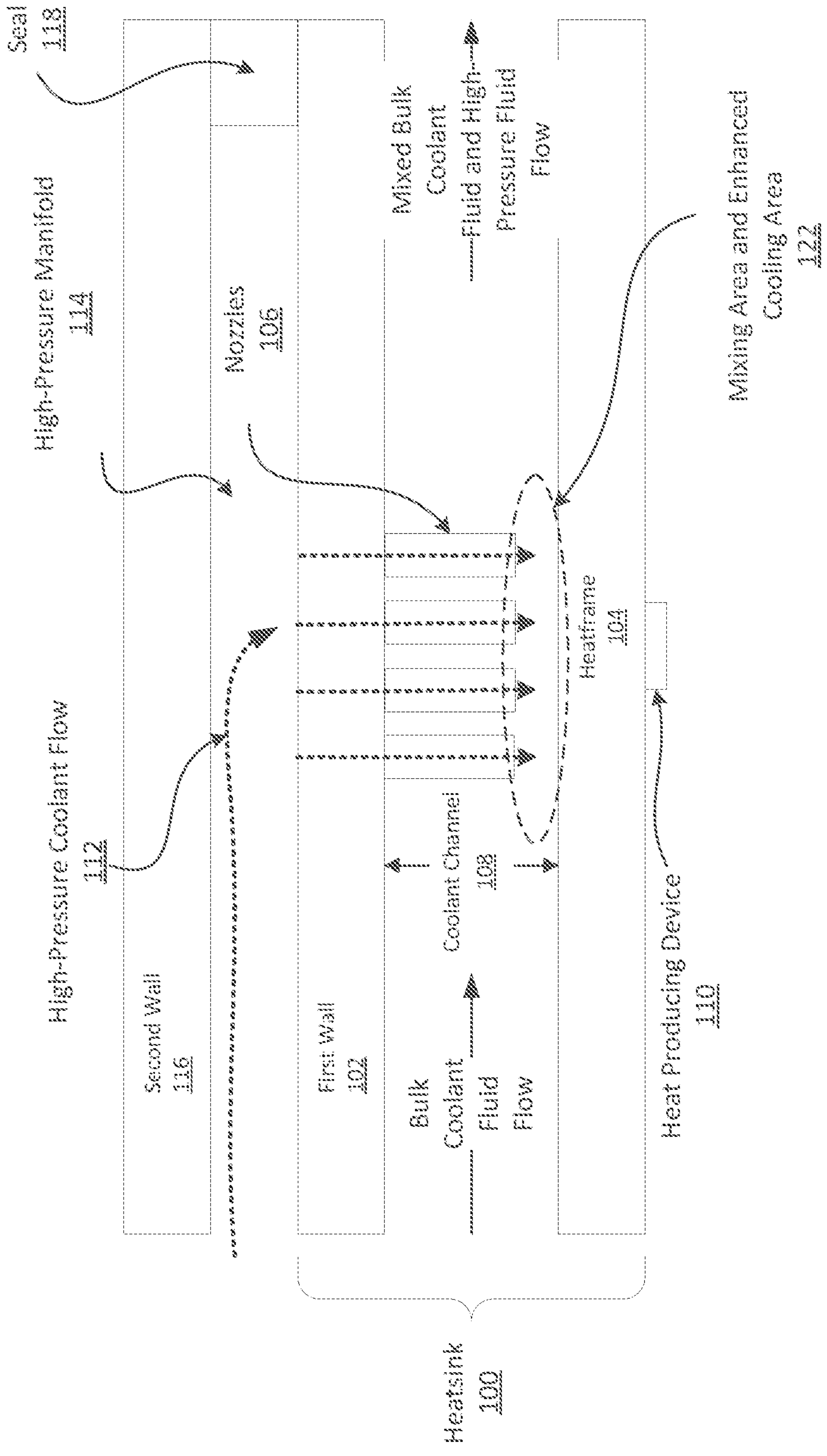
FIGS. 1B and 1C are illustrations of non-limiting variations of the embodiment of a heatsink shown in FIG. 1A.
Figure 1C:
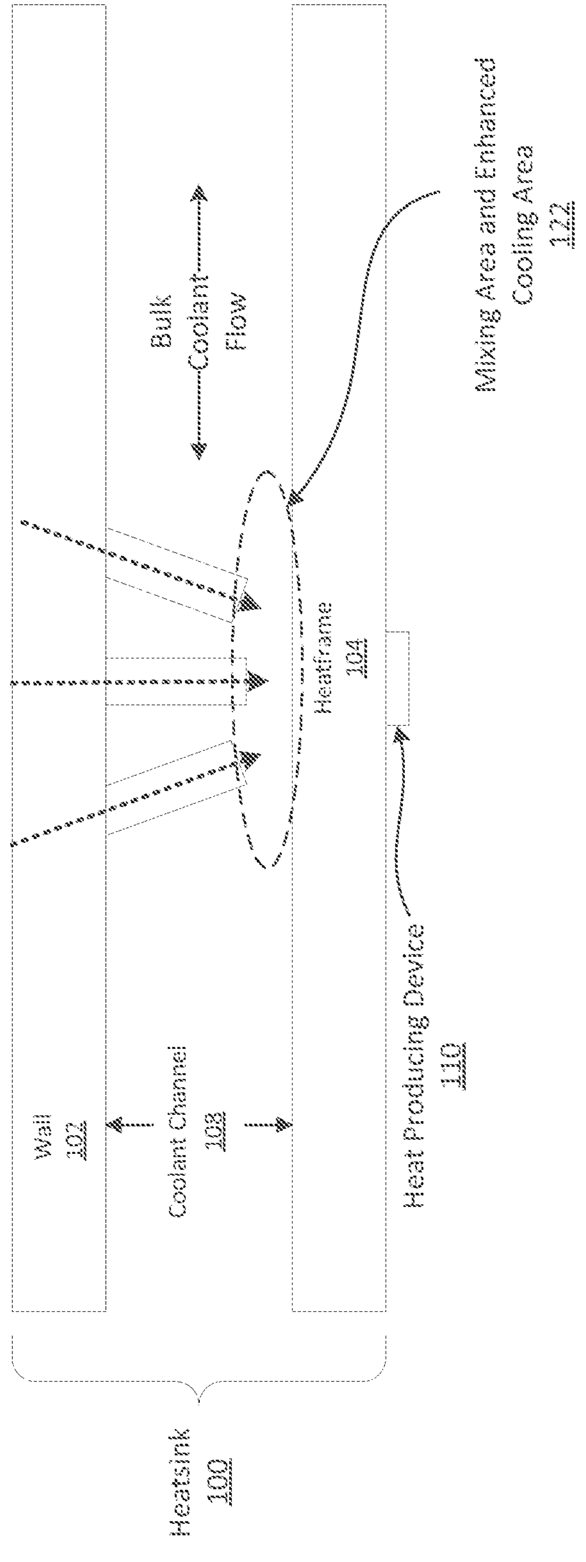

FIGS. 1B and 1C are illustrations of non-limiting variations of the embodiment of a heatsink 100 shown in FIG. 1A. FIG. 1B is a cross-section view of a heatsink 100, where the heatsink 100 is comprised of a heatframe 104, a first wall 102 and a second wall 116 such that the high-pressure manifold 114 is formed between the first wall 102 and the second wall 116, the high-pressure manifold 114 having an inlet (not shown) and a seal 118 such that the high-pressure coolant fluid 112 flows into the high-pressure manifold 114 and is forced out the one or more nozzles 106 to impinge onto the heatframe 104 and into the bulk coolant fluid to form the mixing area and enhanced cooling area 122. In some instances, all or a portion of the heatframe 100 shown in the figures can be formed using three-dimensional (3D) printing.

Generally, the first wall 102, the second wall (if the heatsink 100 comprises a second wall (116)), and the heatframe 104 are each comprised of thermally-conductive materials. However, in some instances, the first wall 102 may be at least partially comprised of thermally non-conductive material while the heatframe 104 is comprised of thermally-conductive material. Also, in some instances, the second wall 116 (where provided) can be at least partially comprised of thermally non-conducive material as both first wall 102 and second wall 116 are generally not in the thermal paths to overall heat dissipation. These walls can be assembled/modulated through soldering, brazing, welding, mounted with screws with gasket, or epoxied. By using thermally non-conductive materials for portions of the heatsink 100, the thermal path through the heatsink can be controlled.

FIG. 1C is a cross-section view of a heatsink 100, where the heatsink 100 is comprised of a heatframe 104, a wall 102 and a coolant channel 108 therebetween such that the high-pressure coolant fluid 112 flows out the one or more nozzles 106 to impinge onto the heatframe 104 and into the bulk coolant fluid to form the mixing area and enhanced cooling area 122. In this example, at least one of the one or more nozzles 106 is not perpendicular to the wall 102 and/or the heatframe 104. This configuration results in a smaller, more focused impingement area having increased turbulence.

Figure 1D:
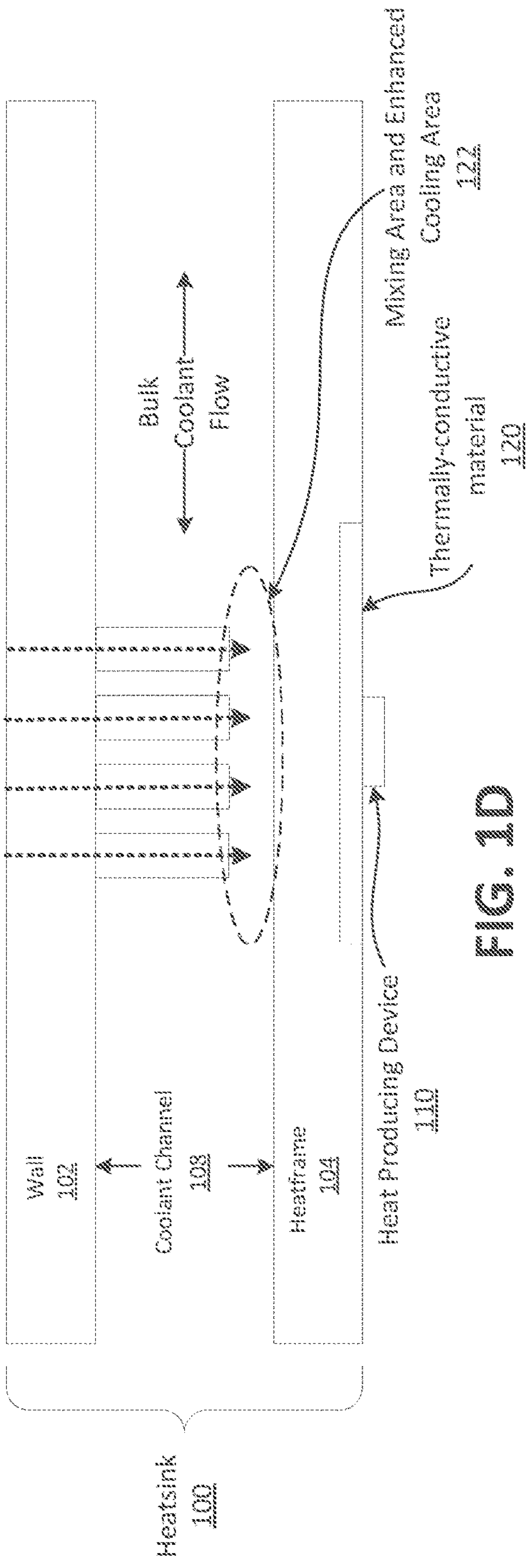
FIGS. 1D and 1E are illustrations of non-limiting variations of the embodiment of a heatsink shown in FIGS. 1A-1C, further comprising a piece of thermally-conductive material.
Figure 1E:
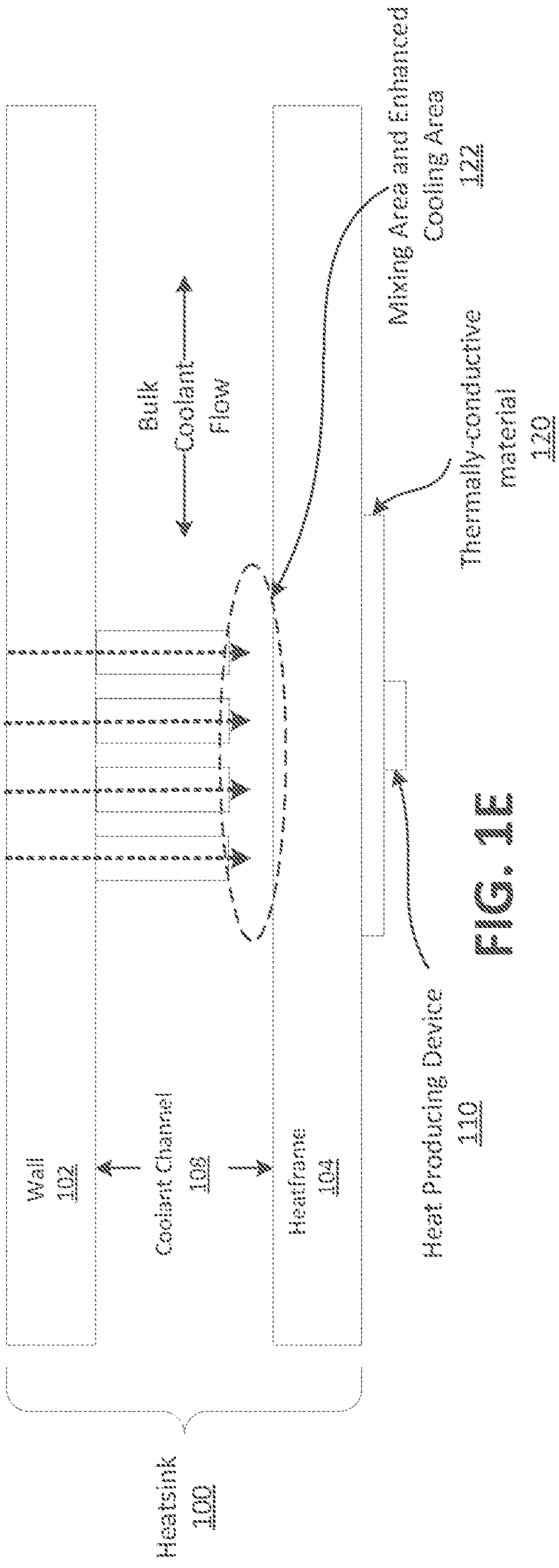

FIGS. 1D and 1E are cross-section views of a heatsink 100 where the heatsink 100 is comprised of a heatframe 104, a wall 102 and a coolant channel 108 therebetween such that the high-pressure coolant fluid 112 flows out the one or more nozzles 106 to impinge onto the heatframe 104 and into the bulk coolant fluid to form the mixing area and enhanced cooling area 122. These examples include a piece of thermally-conductive material (material having a high thermal conduction coefficient, for example a thermal conduction coefficient of 150 W/mK, or greater) 120 to produce an area of enhanced localized cooling. The area may range from approximately 100 $mm^2$ to 2500 $mm^2$. Generally, a heat producing device 110 will be at least partially in contact with the piece of thermally-conductive material 120 or at least in very close proximity to the piece of thermally-conductive material 120. In some instances, (FIG. 1D, for example), the piece of thermally-conductive material 120 may be at least partially embedded into the heatframe 104 and/or wall 102 (not shown). In other instances, the piece of thermally-conductive material 120 may be in contact with or proximate to the outer side of the heatframe 104 and/or the wall 102. The piece of thermally-conductive material 120 may be comprised of copper, aluminum, gold, silver, thermally-conductive ceramic or a thermally-conductive diamond composite, and/or any other thermally-conductive materials, or combinations thereof. The piece of thermally-conductive material 120 may welded, soldered, brazed, glued, compression fit, screwed, or use any other attachment means to attach to the wall 102 and/or the heatframe 104. In some instances, a gasket or other material (not shown) may be used between the wall 102 and/or the heatframe 104 and the thermally-conductive material 120. The thermal path through the heatsink 100 may be modulated through soldering, brazing, welding, mounted with screws with gasket, or epoxied. The piece of thermally-conductive material may be of any size, shape or volume that is suitable for use in the heatsink 100.

Figure 2:
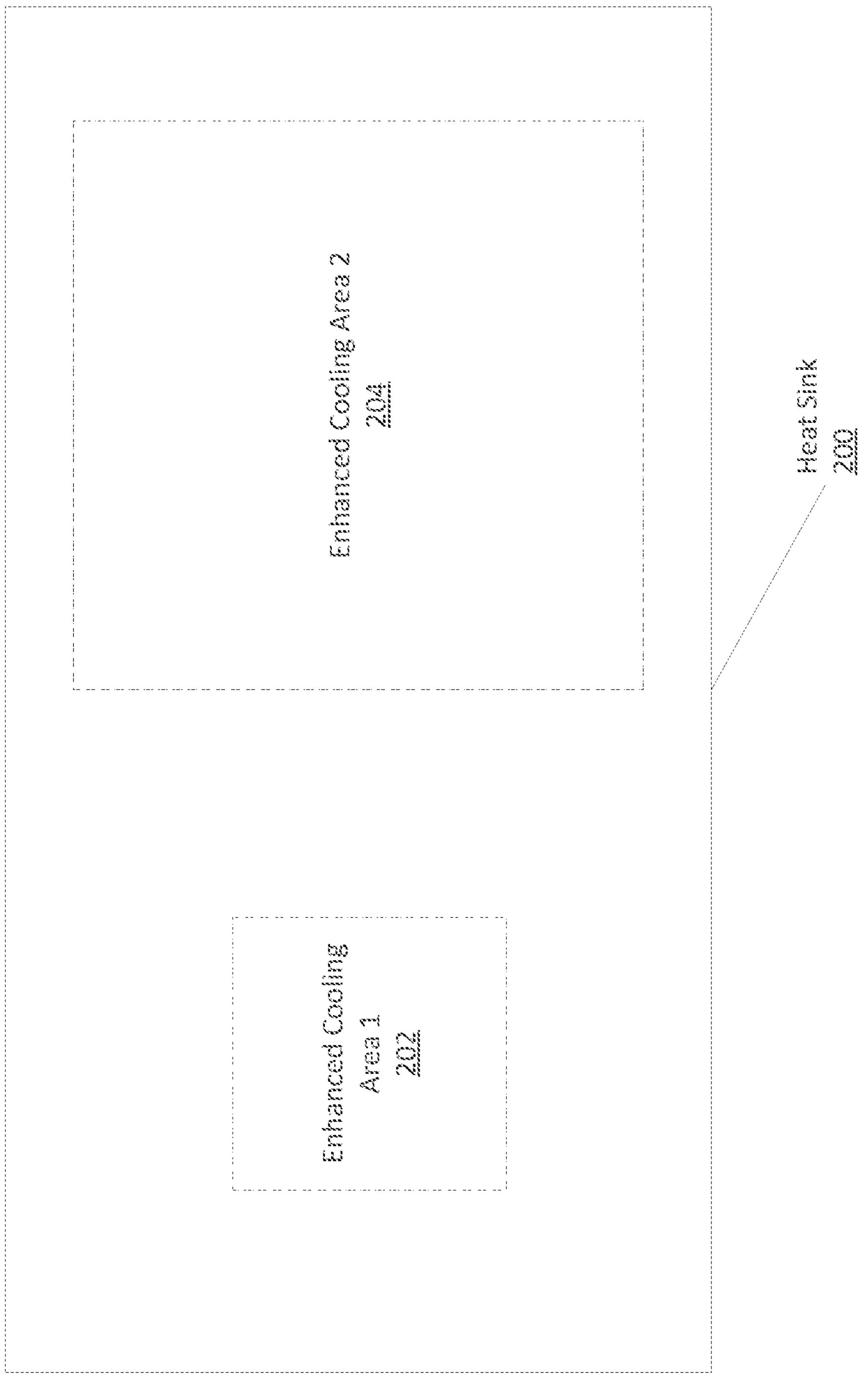
FIG. 2 is a plan view of a heatsink with two enhanced localized cooling areas caused by impingement cooling

FIG. 2 is a plan view of a heatsink 200 with two enhanced localized cooling areas 202, 204 caused by impingement cooling, as described herein. As can be seen in FIG. 2, the number and the size of the enhanced localized cooling areas 202, 204 can vary. Typically, the enhanced localized cooling areas 202, 204 range between approximately 100 $mm^2$ to approximately 2500 $mm^2$. This figure also illustrates that a heatsink 200 can have one or a plurality of cooling areas.

Benefits of the embodiments described herein include solving the downgrade of thermal performance of liquid flow through cooling solution due to its low heat transfer coefficient limited by high pressure drop or high machining cost for complex channel geometries. The disclosed cooling module provides a significantly improved heat transfer characteristics over a conventional channel cold plate heat frame at least because of a significant increase in effective liquid contact area; a significant increase in Nusselt number thru swirling motion, turbulence, etc.; a relatively lower pressure drop than complex geometries channels (i.e. Micro-channels); as well as lower cost and ease of manufacture.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A heatsink having enhanced localized cooling, said heatsink comprising:

a first wall;

a heatframe;

a coolant channel defined at least by the first wall and the heatframe;

a bulk coolant and a high-pressure coolant; and a high-pressure manifold defined by an open inlet, the first wall, a second wall, and a seal to form a chamber having an only outlet a plurality of nozzles, wherein each of the plurality of nozzles has a portion that extends into the coolant channel and proximate a cooling area of the heatframe, wherein the first wall separates the chamber from the coolant channel so that an only path for the high-pressure coolant is to flow into the open inlet of the high-pressure manifold and out the plurality of nozzles into the coolant channel, wherein each of the plurality of nozzles is separated from any other of the plurality of nozzles such that the bulk coolant flows around the portion that extends into the coolant channel of each of the plurality of nozzles;

wherein the high-pressure coolant is at a pressure higher than the bulk coolant, wherein the plurality of nozzles are configured to mix the high-pressure coolant with the bulk coolant in the coolant channel to create turbulence in the coolant channel proximate the cooling area of the heatframe, said turbulence providing enhanced localized cooling to at least a portion of a heat producing device that is proximate to or in partial contact with the heatframe proximate to the cooling area of the heatframe, and wherein the high-pressure manifold is separate and isolated from the coolant channel except for the nozzles extending into the coolant channel.

2. The heatsink of claim 1 wherein the bulk coolant is at a pressure of 15 to 20 psi and the high-pressure coolant is at the pressure higher than the bulk coolant.

3. The heatsink of claim 1, further comprising a piece of thermally-conductive material, wherein the piece of thermally-conductive material is at least partially embedded into, attached to or proximate the heatframe proximate to the cooling area of the heatframe, wherein the heat producing device is proximate to or in partial contact with the piece of thermally-conductive material, wherein the piece of thermally-conductive material is comprised of copper, aluminum, thermally-conductive ceramic or thermally-conductive diamond composite.

4. The heatsink of claim 3, wherein the piece of thermally-conductive material has a thermal-conductivity rating that is equal to or greater than 150 W/mK.

5. The heatsink of claim 1, wherein at least a portion of the heatsink is formed by 3D printing.

6. The heatsink of claim 1, wherein the cooling area of the heatsink occurs in an area of 100 $mm^2$ to 2500 $mm^2$.

7. The heatsink of claim 1, wherein the heat producing device comprises one or more of a central processing unit (CPU), a graphics processing unit (GPU), a field-programmable gate array (FPGA), a platform control hub (PCH), or a PCI express switch.

8. The heatsink of claim 1, wherein at least one of the bulk coolant and/or the high-pressure coolant is a liquid, and wherein the heatsink is in compliance with a ANSI/VITA 48.4 Liquid Flow Through VPX Plug-In Module standard.

9. The heatsink of claim 1, wherein at least one of the plurality of nozzles is not perpendicular to the first wall and/or the heatframe.

10. A heatsink having enhanced localized cooling, said heatsink comprising:

a first wall;

a second wall;

a heatframe;

a coolant channel defined by at least the first wall and the heatframe, wherein a bulk coolant flows through the coolant channel;

a high-pressure coolant, wherein the high-pressure coolant is at a pressure higher than the bulk coolant; and a plurality of nozzles that extend into the coolant channel, wherein each of the plurality of nozzles has a portion that extends into the coolant channel and proximate a cooling area of the heatframe, wherein a high-pressure manifold is formed between the first wall and the second wall, the high-pressure manifold comprising an open inlet and a seal to form a chamber having as an only outlet the plurality of nozzles that extend into the coolant channel and proximate a cooling area of the heatframe, wherein the first wall separates the chamber from the coolant channel such that an only path for the high-pressure coolant to flow is into the inlet of the high-pressure manifold and out the plurality of nozzles, wherein the plurality of nozzles are configured to create turbulence in the flow of the mixed bulk coolant and the high-pressure coolant, said turbulence creating an enhanced cooling area proximate the, wherein the turbulence provides enhanced localized cooling to at least a portion of a heat producing device that is proximate to or in partial contact with the heatframe proximate to the enhanced cooling area of the heatframe, wherein each of the plurality of nozzles is separated from any other of the plurality of nozzles such that the bulk coolant flows around the portion that extends into the coolant channel of each of the plurality of nozzles, and wherein the high-pressure manifold is separate and isolated from the coolant channel except for the nozzles extending into the coolant channel.

11. The heatsink of claim 10, wherein at least a portion of the first wall and/or the second wall is formed of thermally non-conductive material.

12. The heatsink of claim 11, further comprising a piece of thermally-conductive material, wherein the piece of thermally-conductive material is at least partially embedded into, attached to or proximate to the heatframe proximate to the enhanced cooling area of the heatframe, wherein the heat producing device is proximate to or in partial contact with the piece of thermally-conductive material, wherein the piece of thermally-conductive material is comprised of copper, aluminum, thermally-conductive ceramic or thermally-conductive diamond composite.

13. The heatsink of claim 12, wherein the piece of thermally-conductive material has a thermal-conductivity rating that is equal to or greater than 150 W/mK.

14. The heatsink of claim 11, wherein at least a portion of the heatsink is formed by 3D printing.

15. The heatsink of claim 11, wherein the enhanced cooling area of the heatsink occurs in an area of 100 $mm^2$ to 2500 $mm^2$.

16. The heatsink of any one of claim 11, wherein the heat producing device comprises one or more of a central processing unit (CPU), a graphics processing unit (GPU), a field-programmable gate array (FPGA), a platform control hub (PCH), or a PCI express switch.

17. The heatsink of claim 11, wherein at least one of the bulk coolant and/or the high-pressure coolant is a liquid, and wherein the heatsink is in compliance with a ANSI/VITA 48.4 Liquid Flow Through VPX Plug-In Module standard.

18. The heatsink of claim 11, wherein the bulk coolant is at a pressure of 15 to 20 psi and the high-pressure coolant is at the pressure higher than the bulk coolant.

19. The heatsink of claim 11, wherein at least one of the plurality of nozzles is not perpendicular to the first wall and/or the heatframe.

20. The heatsink of claim 1, wherein at least a portion of the first wall and/or the second wall is formed of thermally non-conductive material.

* * * * *